United States Patent
McCune et al.

(10) Patent No.: US 8,064,855 B2
(45) Date of Patent: Nov. 22, 2011

(54) TRANSMISSION POWER CONTROLLER

(75) Inventors: Earl McCune, Santa Clara, CA (US); Gary Do, San Jose, CA (US); Wayne Lee, San Mateo, CA (US)

(73) Assignee: Panasonic Corporation, Osaka (JP)

( * ) Notice: Subject to any disclaimer, the term of this patent is extended or adjusted under 35 U.S.C. 154(b) by 608 days.

(21) Appl. No.: 11/923,408

(22) Filed: Oct. 24, 2007

(65) Prior Publication Data

US 2008/0268799 A1  Oct. 30, 2008

Related U.S. Application Data

(60) Provisional application No. 60/854,072, filed on Oct. 25, 2006.

(51) Int. Cl.
*H04B 1/04* (2006.01)

(52) U.S. Cl. .................................. 455/127.1; 455/126

(58) Field of Classification Search .................. 455/91, 455/102, 108, 110, 115.1, 116, 126, 127.1, 455/127.2, 127.4, 127.5, 550.1, 552.1, 574; 330/278, 282
See application file for complete search history.

(56) References Cited

U.S. PATENT DOCUMENTS

| | | | |
|---|---|---|---|
| 6,256,483 B1 * | 7/2001 | Moerder et al. ............ | 455/115.1 |
| 6,670,849 B1 * | 12/2003 | Damgaard et al. ............ | 330/129 |
| 7,424,064 B2 * | 9/2008 | Shakeshaft et al. ............ | 375/295 |
| 7,539,462 B2 * | 5/2009 | Peckham et al. ................ | 455/83 |
| 2002/0013156 A1 | 1/2002 | Yamamoto | |
| 2003/0026235 A1 | 2/2003 | Vayanos | |
| 2005/0135502 A1 | 6/2005 | Zhang | |
| 2005/0206457 A1 | 9/2005 | Martin | |
| 2005/0245214 A1 | 11/2005 | Nakamura | |
| 2006/0046666 A1 | 3/2006 | Hara | |
| 2007/0184796 A1 * | 8/2007 | Drogi et al. ................ | 455/127.1 |
| 2007/0264947 A1 * | 11/2007 | Rozenblit et al. .......... | 455/127.2 |
| 2008/0032634 A1 * | 2/2008 | Magoon et al. ................ | 455/75 |
| 2008/0153438 A1 * | 6/2008 | Arayashiki et al. ........ | 455/127.1 |

FOREIGN PATENT DOCUMENTS

| | | |
|---|---|---|
| EP | 1 710 918 | 10/2006 |
| JP | 2001-069075 | 3/2001 |
| JP | 2004-535735 | 11/2004 |
| JP | 2005-295523 | 10/2005 |

OTHER PUBLICATIONS

International Search Report dated Jan. 29, 2008.
Extended European Search Report dated Nov. 5, 2010.

\* cited by examiner

*Primary Examiner* — Blane J Jackson
(74) *Attorney, Agent, or Firm* — Dickinson Wright PLLC

(57) ABSTRACT

A transmission apparatus has two modes of power amplifier operation, in which mode 1 is inherently accurate, mode 2 is inherently less accurate, and measurement of a power amplifier output from mode 1 is used to correct a power amplifier output in mode 2. Mode 1 may be a compressed mode and mode 2 may be a non-compressed mode. The apparatus may include a power controller that provides overlapping scaling factor sets for modes 1 and 2 and controls transmission power using the scaling factor sets. Upon a mode transition, the controller uses the overlapping scaling factors and changes the scaling factor set for the mode of a destination of the transition based on actual measurement representative of transmission power, for example, by carrying out power alignment loop operations. A cellular mobile device may include such transmission apparatus. A polar modulation transmitter is also disclosed.

6 Claims, 16 Drawing Sheets

Step size for individual power commands (Table 6.4)

| TPC_cmd | Transmitter power control range | | | | | |
|---|---|---|---|---|---|---|
| | 1 dB step size | | 2 dB step size | | 3 dB step size | |
| | Lower | Upper | Lower | Upper | Lower | Upper |
| 1 | +0.5 dB | +1.5 dB | +1 dB | +3 dB | +1.5 dB | +4.5 dB |
| 0 | -0.5 dB | +0.5 dB | -0.5 dB | +0.5 dB | -0.5 dB | +0.5 dB |
| -1 | -0.5 dB | -1.5 dB | -1 dB | -3 dB | -1.5 dB | -4.5 dB |

FIG. 3

Consolidated step size tolerance

| nominal step size | step size tolerance |
|---|---|
| 0 dB | +/- 0.5 dB |
| 1 dB | +/- 0.5 dB ← Most restrictive |
| 2 dB | +/- 1.0 dB |
| 3 dB | +/- 1.5 dB |
| 4 - 10 dB | +/- 2.0 dB |
| 11 - 15 dB | +/- 3.0 dB |
| 16 - 20 dB | +/- 4.0 dB |
| ≥ 21 dB | +/- 6.0 dB |

FIG. 4

Net power change for groups of power commands (Table 6.5)

| TPC_ cmd group | Transmitter power control range after 10 equal TPC_ cmd groups | | | | Transmitter power control range after 7 equal TPC_cmd groups | |
|---|---|---|---|---|---|---|
| | 1 dB step size | | 2 dB step size | | 3 dB step size | |
| | Lower | Upper | Lower | Upper | Lower | Upper |
| +1 | +8 dB | +12 dB | +16 dB | +24 dB | +16 dB | +26 dB |
| 0 | +1 dB | +1 dB | −1 dB | +1 dB | −1 dB | +1 dB |
| −1 | −8 dB | −12 dB | −16 dB | −24 dB | −16 dB | −26 dB |
| 0,0,0,0,+1 | +6 dB | +14 dB | N/A | N/A | N/A | N/A |
| 0,0,0,0,−1 | −6 dB | −14 dB | N/A | N/A | N/A | N/A |

In this table, these requirements are the most restrictive (10 equal steps of 1 dB each must result in a net power difference of 10 ± 2 dB)

FIG. 5

TRANSMISSION POWER CONTROLLER

BACKGROUND OF THE INVENTION

1. Field of the Invention

The present invention relates to a transmission apparatus using a power amplifier (hereinafter "PA").

2. Description of the Related Art

FIG. 1 shows an example of a related art transmission apparatus using polar modulation scheme. The transmission apparatus is provided with a polar signal generation circuit 1, an amplitude control circuit 2, a phase modulated signal generation circuit 3 and a PA 4. In this transmission apparatus, the polar signal generation circuit 1 generates a signal in accordance with the amplitude and phase of a transmit modulated signal from an input signal, and, based on this signal, the amplitude control circuit 2 and the phase modulated signal generation circuit 3 generate the power supply to PA 4 and a phase modulated signal, respectively.

In practice, the transmission apparatus maintains the dynamic range of transmission power by switching the PA 4 between compressed mode and noncompressed mode. That is, this transmission apparatus operates the PA 4 in compressed mode when high transmission power is required. On the other hand, the transmission apparatus operates the PA 4 in noncompressed mode when only low transmission power is required. To be more specific, in compressed mode, the transmission apparatus carries out amplitude modulation by changing the power supply to the PA 4 according to the amplitude signal. This mode is inherently very accurate. On the other hand, in noncompressed mode, the transmission apparatus operates the PA 4 in a less accurate compressed mode.

However, with related art transmission apparatus, there is a threat that, when compressed mode ("c-mode") and noncompressed mode ("n-mode") switch in transmission power control, drift of maximum 5 dB or more occurs in transmission power due to differences in characteristics between the modes (drift due to temperature, drift due to wear, drift due to load, etc.).

This will be explained briefly using FIG. 2. As shown in FIG. 2, output power of compressed mode is relatively accurate. On the other hand, output power of noncompressed mode changes due to drift due to temperature, drift due to wear, drift due to load, etc.

As shown in FIG. 2, output power of noncompressed mode tends to drift due to various factors and therefore is likely to be discontinuous when compressed mode and noncompressed mode switch. As a result, large drift in transmission power is likely to occur.

Now, according to 3GPP 25.101, the requirements shown in FIG. 3 to FIG. 5 need to be fulfilled in terms of transmission power errors. With related art transmission apparatus, however, it is difficult to fulfill these requirements provided in 3GPP 25.101, when compressed mode and noncompressed mode switch.

SUMMARY OF THE INVENTION

It is therefore an object of the present invention to provide a transmission apparatus capable of minimizing drift in transmission power (discontinuity in output power step) due to mode switching between inherently accurate mode 1 (such as compressed mode) and inherently less accurate mode 2 (such as noncompressed mode) during transmission power control.

In accordance with one aspect, the transmission apparatus of the present invention operates in two modes of power amplifier operation, where: mode 1 (such as compressed mode) is inherently accurate; mode 2 (such as noncompressed mode) is inherently less accurate; and measurement of power amplifier output from mode 1 is used to correct power amplifier output in mode 2.

In accordance with another aspect, the transmission apparatus of the present invention employs a configuration having a transmission power controller that provides a scaling factor set for model (such as compressed mode) and a scaling factor set for mode 2 (such as noncompressed mode) having a region where the scaling factor sets overlap around a power border, and controls transmission power using the scaling factor sets.

In accordance with another aspect of the present invention, the transmission apparatus of the present invention employs a configuration where, upon a mode transition, the transmission power controller uses the scaling factor sets for both modes that overlap and changes the scaling factor set for the mode of a destination of the transition based on actual measurement representative of transmission power.

BRIEF DESCRIPTION OF THE DRAWINGS

The accompanying drawings, which are incorporated in and constitute a part of the specification, illustrate presently preferred non-limiting examples of exemplary embodiments of the invention, and, together with the general description given above and the detailed description of the preferred embodiments given below, serve to explain the principles and concepts of the invention, in which like reference characters designate like or corresponding parts throughout the several drawings. The above and other objects and features of the invention will appear more fully hereinafter from a consideration of the following description taken in connection with the accompanying drawings in which:

FIG. 3 illustrates step size for individual power commands;

FIG. 4 illustrates consolidated step size tolerance;

FIG. 5 illustrates net power change for groups of commands;

DETAILED DESCRIPTION OF THE PREFERRED EMBODIMENTS

Now, embodiments of the present invention will be explained in detail below with reference to the accompanying drawings. Reference will now be made in detail to the presently non-limiting, exemplary and preferred embodiments of the invention as illustrated in the accompanying drawings. The nature, concepts, objectives and advantages of the present invention will become more apparent to those skilled in the art after considering the following detailed description in connection with the accompanying drawings. The following description is provided in order to explain preferred embodiments of the present invention, with the particular features and details shown therein being by way of non-limiting illustrative examples of various embodiments of the present invention. The particular features and details are presented with the goal of providing what is believed to be the most useful and readily understood description of the principles and conceptual versions of the present invention. In this regard, no attempt is made to show structural details of the invention in more detail than is necessary for the fundamental understanding of the present invention. The detailed description considered with the appended drawings are intended to make apparent to those skilled in the art how the several forms of the present invention may be embodied in practice.

Although a case will be described below with the embodiment of the present invention where the present invention is applied to a transmission apparatus using a polar modulation scheme, the present invention is by no means limited to application to transmission apparatus using a polar modulation scheme and is widely applicable to transmission apparatus using PA. For example, the present invention is suitable for use for cellular mobiles.

Figure 1:
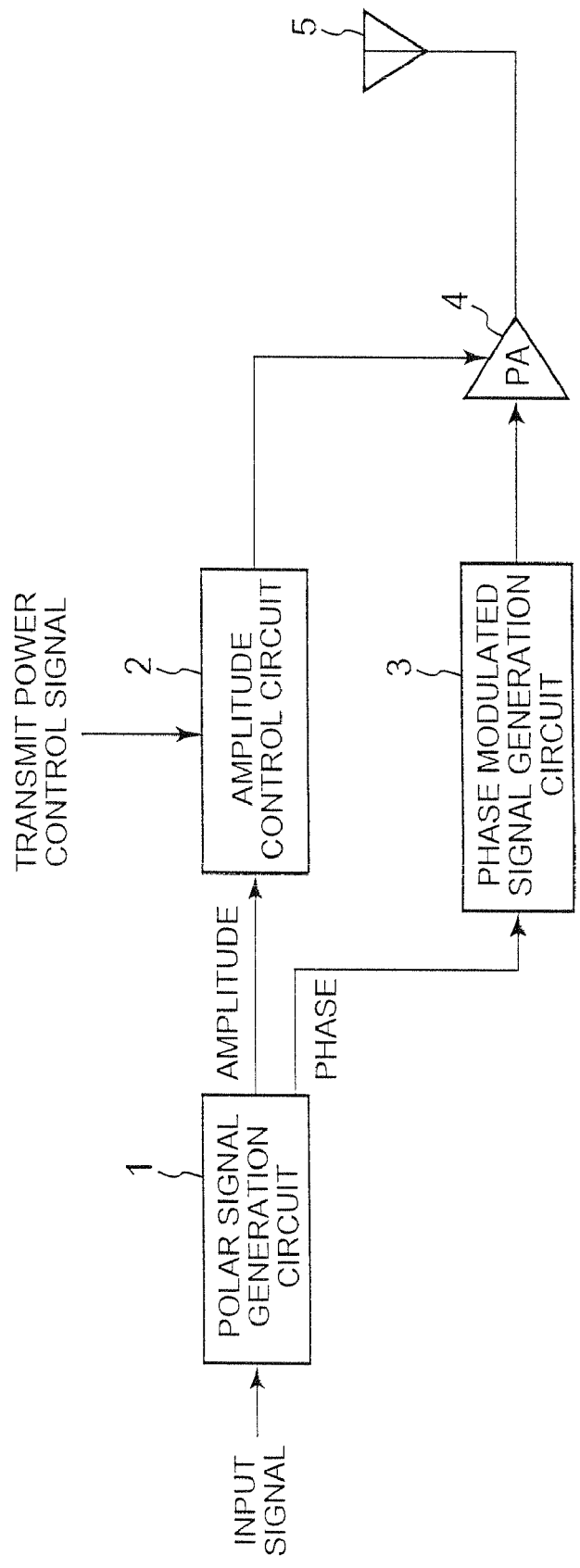
FIG. 1 is a block diagram showing a configuration example of a related art transmission apparatus.
Figure 2:
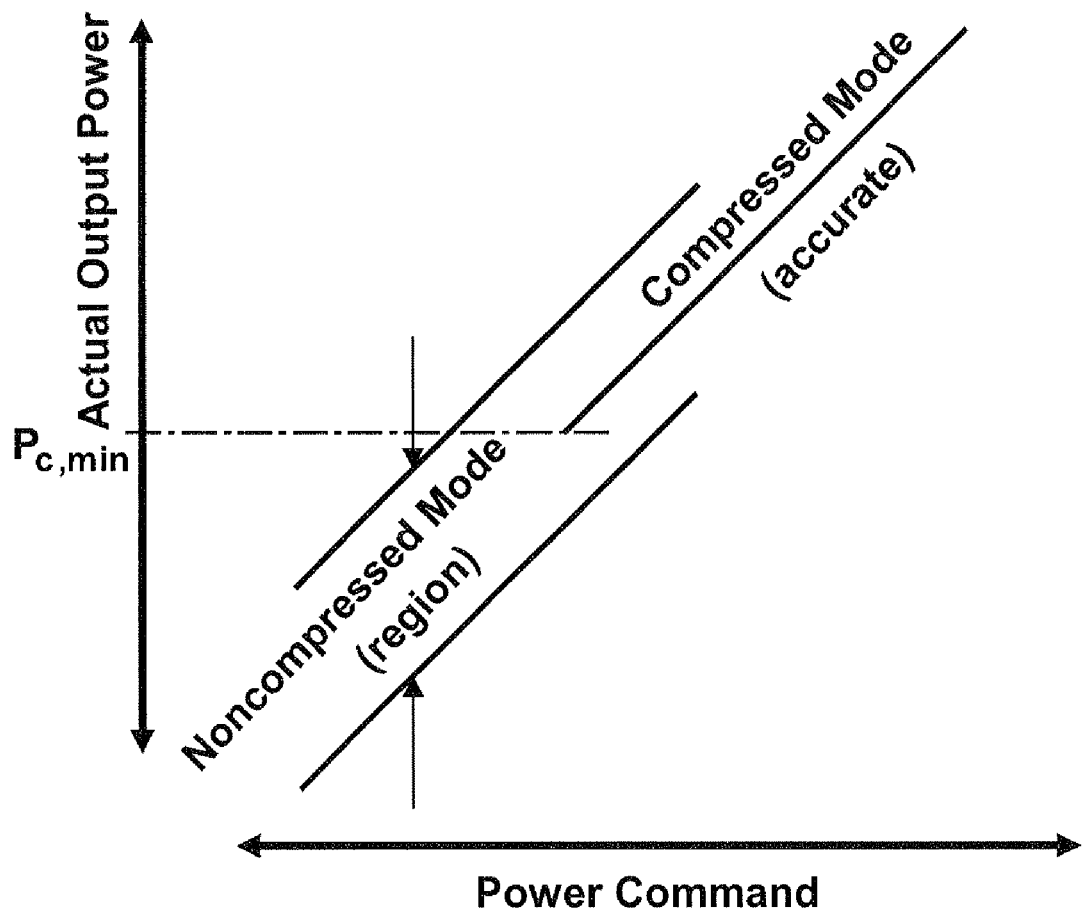
FIG. 2 illustrates drift in transmission power (discontinuity in output power) due to mode switching.
Figure 6:
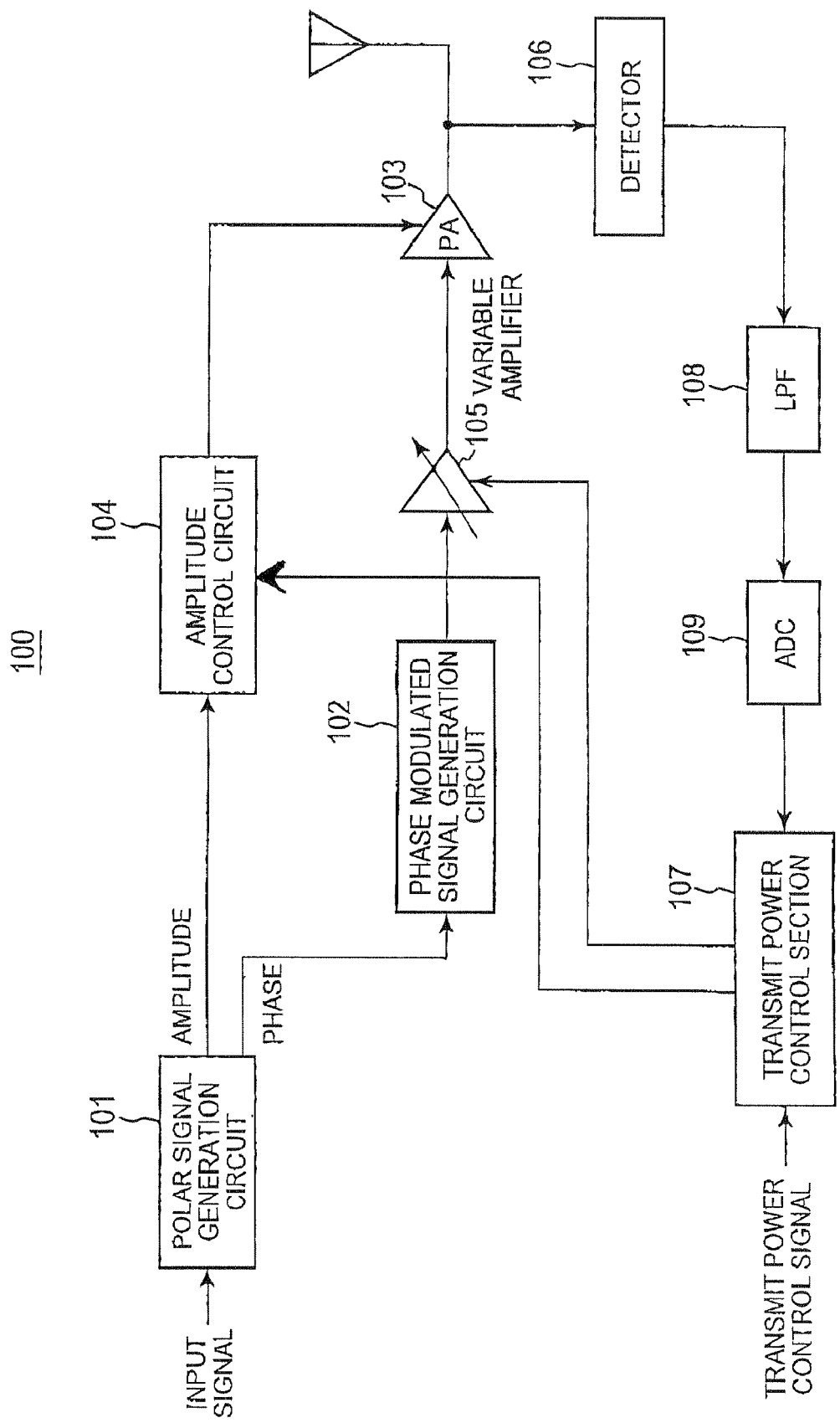
FIG. 6 is a block diagram showing a configuration of a transmission apparatus according to an embodiment of the present invention.

FIG. 6 shows the configuration of the transmission apparatus according to the present embodiment of the present invention. Transmission apparatus 100 has: a polar signal generation circuit 101; a phase modulated signal generation circuit 102; a power amplifier ("PA") 103; an amplitude control circuit 104; a variable amplifier 105; a detector 106 that detects output power of the PA 103; and a transmission power controller 107.

The polar signal generation circuit 101 generates an amplitude component signal and a phase component signal from an input signal. The phase modulated signal generation circuit 102 generates an RF phase modulated signal from the phase component signal. The variable amplifier 105 amplifies or attenuates the RF phase modulated signal and outputs the result to the PA 103. The amplitude control circuit 104 forms the power supply to the PA 103 by multiplying the amplitude component signal by the scaling factor from the transmission power controller 107, and outputs the result to the supply terminal of the PA 103.

The transmission power controller 107 receives the input of the detector 106 via a low pass filter ("LPF") 108 and an analogue-to-digital converter ("ADC") 109. The transmission power controller 107 receives a transmission power control signal. The transmission power controller 107 controls the transmission power of the transmission apparatus 100 based on transmission power control command and the detection result in the detector 106.

In practice, the transmission power controller 107 transmits the scaling factor to the amplitude control circuit 104 and the variable amplifier 105, and controls the power supply to the PA 103 and the input signal (RF phase modulated signal) level at the PA 103. The transmission power controller 107 calculates the scaling factor by combining the original value of the scaling factor, which is acquired by referring to a table using the transmission power control signal as an address, and a correction value of the scaling factor acquired from the detection result in the detector 106.

Figure 7:
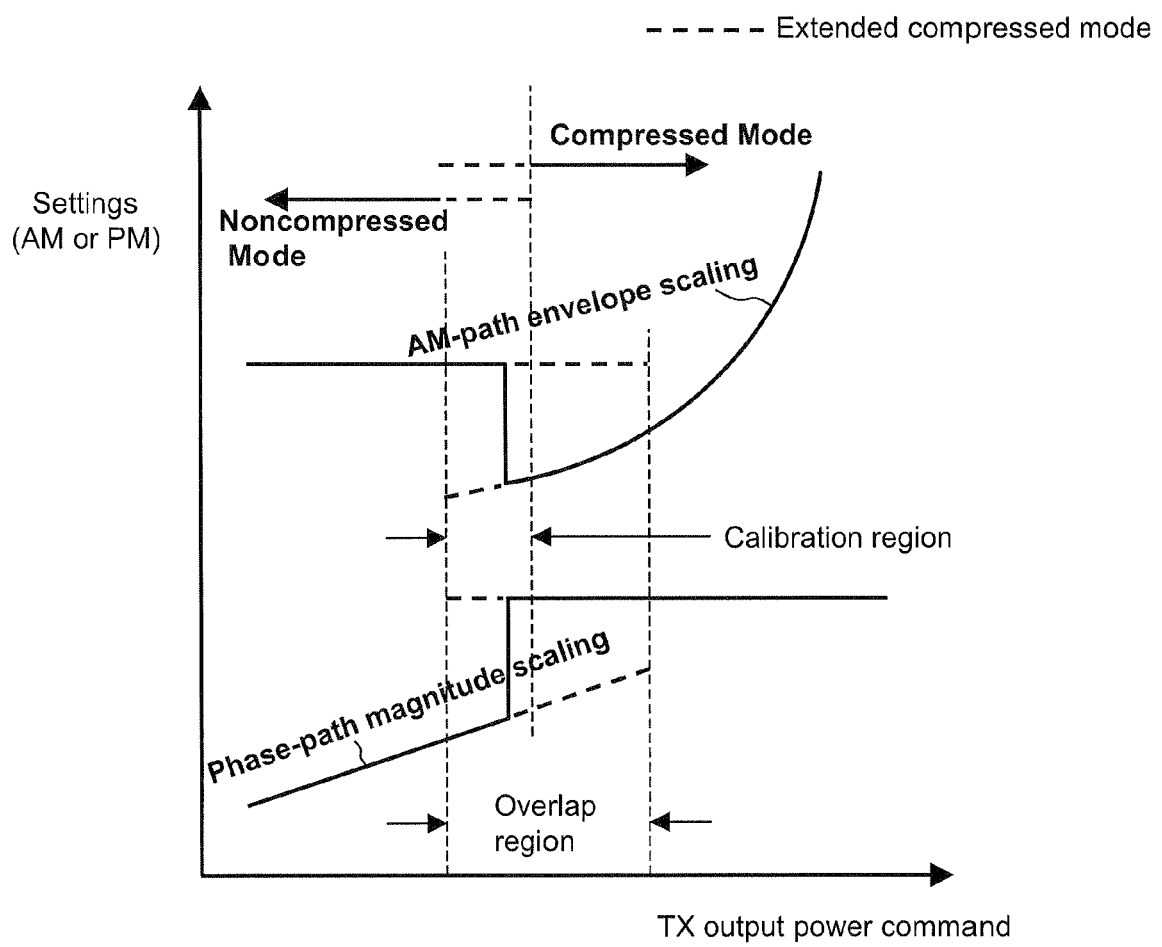
FIG. 7 illustrates operation of a power alignment loop ("PAL") according to an embodiment of the present invention.

FIG. 7 illustrates scaling factor sets (hereinafter "power tables") provided in the transmission power controller 107. As shown in FIG. 7, the transmission power controller 107 has a scaling factor set for compressed mode and a scaling factor set for noncompressed mode. The scaling factor set for compressed mode and the scaling factor set for noncompressed mode have an overlap region in the mode transition region.

The transmission power controller 107 of the present embodiment will be described in detail using FIG. 7.

In compressed mode, transmission power control is performed by scaling the signal envelope (AM path). In noncompressed mode, transmission power control is performed using the phase path, the envelope alone being the AM path.

The overlap region refers to the output power range where either mode yields the needed output power. The calibration region refers to the output power range where mode transfer is effected. The power detector feedback signal is activated only when needed.

The transmission apparatus keeps track of absolute TX output power (PLEV).

$$PLEV_k = \sum_{k=1}^{N-1} TPC_k + PLEV_0$$

where:
 PLEV: Absolute transmission output power
 TPC: Step size for individual power commands (0, ±1 dB, ±2 dB or ±3 dB in case of FIG. 3)
 Pc,min: Minimum compressed mode power level (dBm)
In the transmission power controller 107, mode transition thresholds are defined as follows:

Switch from compressed mode to noncompressed mode is carried out when: $PLEV_k \geq P_{C,min}$ and $PLEV_k + TPC_{k+1} < P_{C,min}$. Switch from noncompressed mode to compressed mode is carried out when: $PLEV_k < P_{C,min}$ and $PLEV_k + TPC_{k+1} \geq P_{C,min}$.

Figure 8:
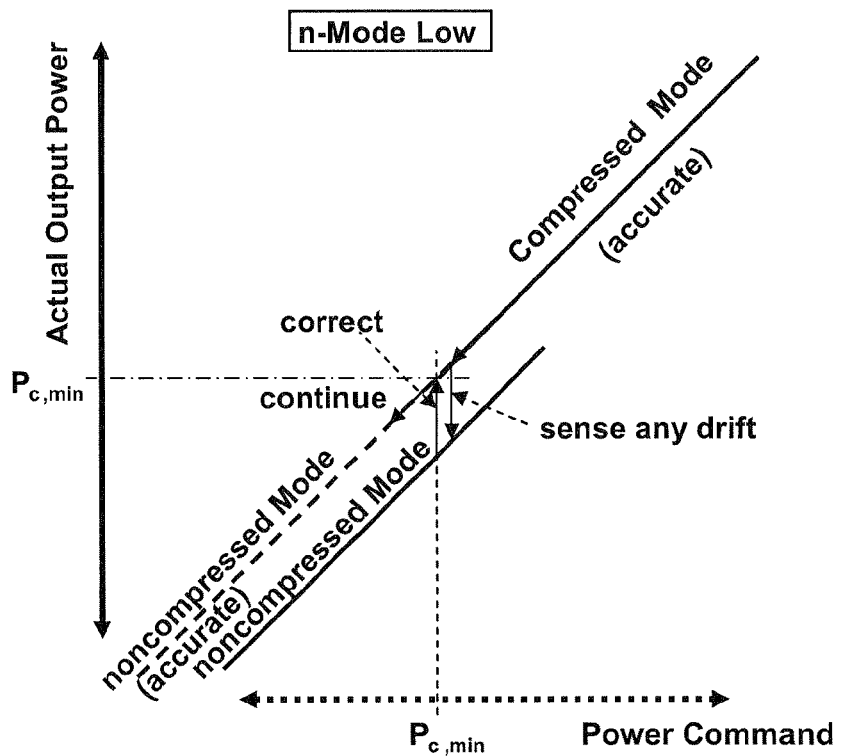
FIG. 8 illustrates state transition from compressed mode to noncompressed mode when output power of noncompressed mode is low.
Figure 9:
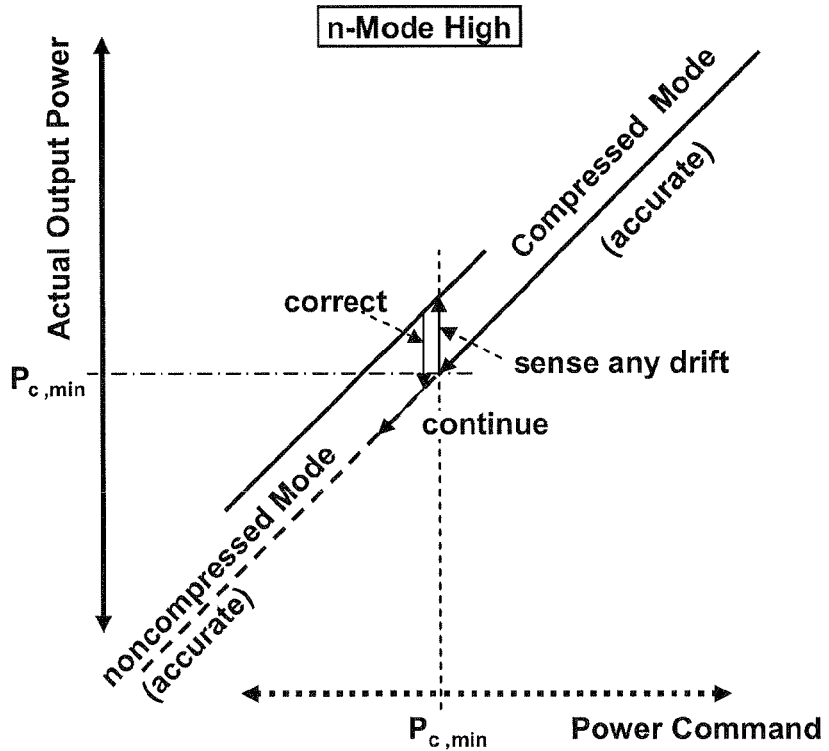
FIG. 9 illustrates state transition from compressed mode to noncompressed mode when output power of noncompressed mode is high.

FIG. 8 illustrates transition operation from compressed mode to noncompressed mode when output power of noncompressed mode is too low. FIG. 9 illustrates transition operation from compressed mode to noncompressed mode when output power of noncompressed mode is too high.

In FIG. 8 and FIG. 9, the transmission apparatus 100 remains in compressed mode to its lowest power capability. The transmission apparatus 100 briefly uses the PAL to sense what drift (if any) noncompressed mode has from the original power calibrations for the same output power. Then, transmission apparatus 100 corrects the noncompressed mode power parameters to nullify any drift.

Figure 10:
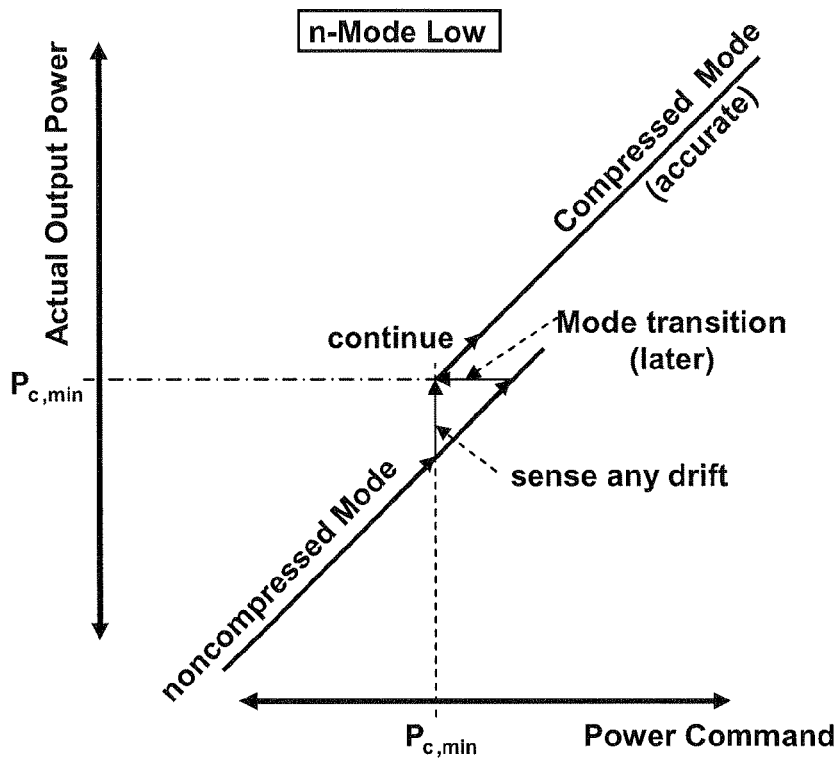
FIG. 10 illustrates state transition from noncompressed mode to compressed mode when output power of noncompressed mode is low.
Figure 11:
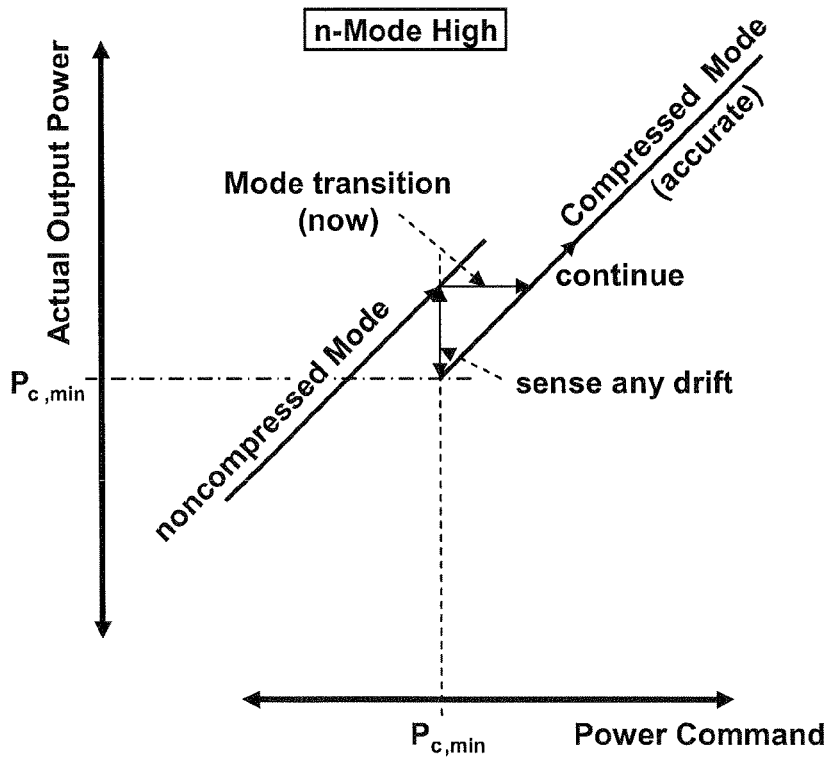
FIG. 11 illustrates state transition from noncompressed mode to compressed mode when output power of noncompressed mode is high.

FIG. 10 illustrates transition operation from noncompressed mode to compressed mode when output power of noncompressed mode is too low. FIG. 11 illustrates transition operation from noncompressed mode to compressed mode when output power of noncompressed mode is too high.

In FIG. 10 and FIG. 11, horizontal transitions maintain the actual output power from the transmission apparatus. When the internal output command equals the intended noncompressed mode to compressed mode transition power, the transmission apparatus 100 measures the noncompressed mode drift. If drift occurs on the low side, the transmission apparatus 100 stays in noncompressed mode until noncompressed mode power is in the overlap region, and then transitions to compressed mode. If drift is on the high side, the transmission apparatus 100 indexes into the compressed mode calibration table to maintain output power and transitions to compressed mode.

Figure 12A:
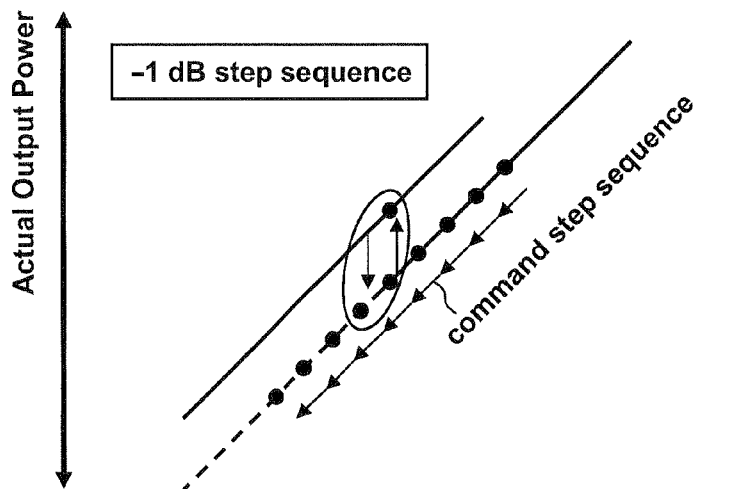
FIG. 12A illustrates −1 dB step sequence from compressed mode to noncompressed mode when output power of noncompressed mode is high.
Figure 12B:
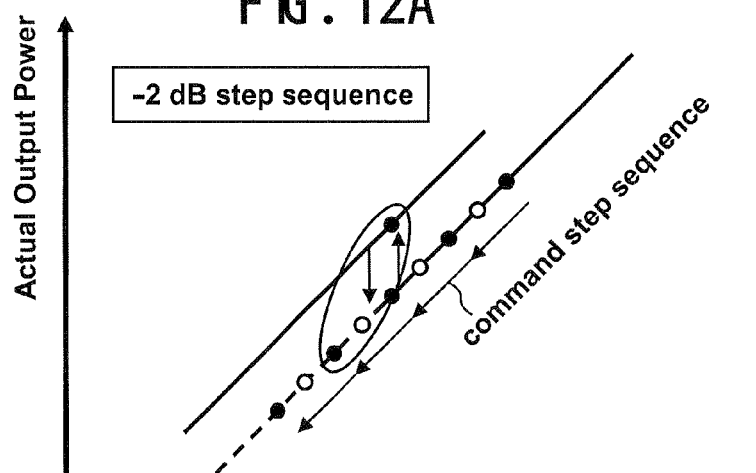
FIG. 12B illustrates −2 dB step sequence from compressed mode to noncompressed mode when output power of noncompressed mode is high.
Figure 12C:
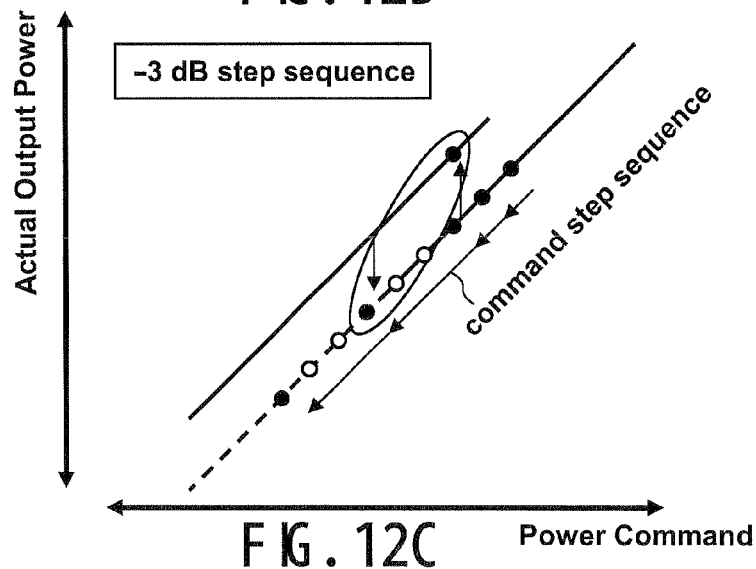
FIG. 12C illustrates −3 dB step sequence from compressed mode to noncompressed mode when output power of noncompressed mode is high.

FIG. 12A, FIG. 12B and FIG. 12C each illustrate transition operation from compressed mode to noncompressed mode when output power of noncompressed mode is too high. FIG. 12A illustrates a simple case where transmission power is reduced −1 dB at a time. FIG. 12B illustrates a case where transmission power is reduced −2 dB at a time. FIG. 12C illustrates a case where transmission power is reduced −3 dB at a time.

Figure 13:
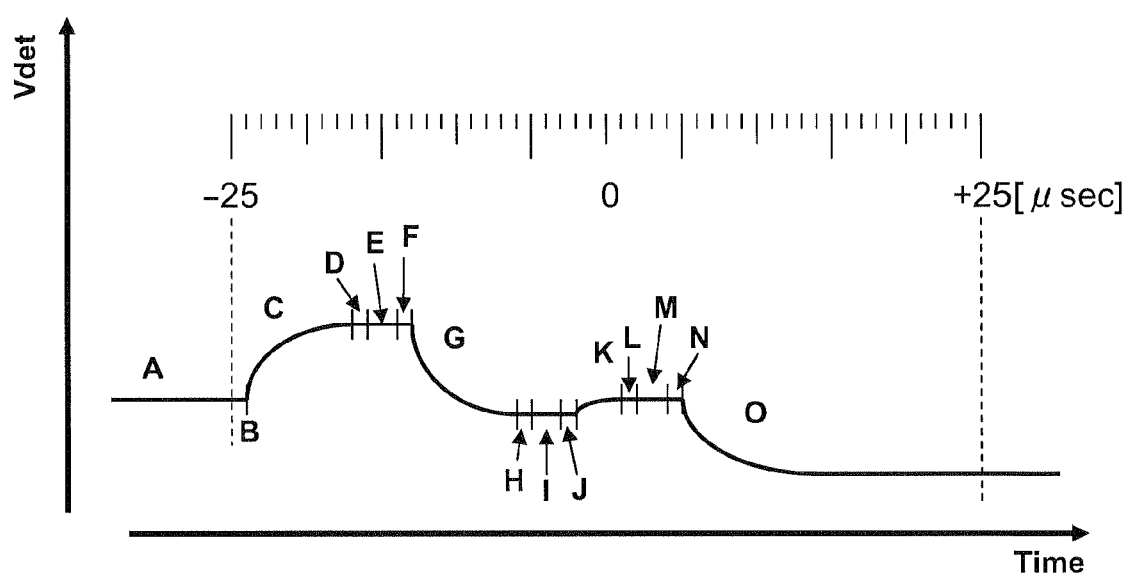
FIG. 13 illustrates transition operation from compressed mode to noncompressed mode when output power of noncompressed mode is high.

FIG. 13 illustrates how the transmission apparatus 100 transitions from compressed mode to noncompressed mode when output power of noncompressed mode is too high. The transmission apparatus 100 carries out the following operations (A) to (O) at the points shown in FIG. 13.
(A) Measure baseline Vdet in compressed mode
(B) Mode switch to noncompressed mode, same output power command
(C) Wait for Vdet to settle
(D) Read new Vdet
(E) Compute a first noncompressed mode power correction
(F) Command noncompressed mode with this new correction
(G) Wait for Vdet to settle
(H) Read new Vdet
(I) Compute a fine noncompressed mode power correction
(J) Command noncompressed mode with this updated correction
(K) Wait for Vdet to settle
(L) Read new Vdet
(M) Compute a final noncompressed mode power correction
(N) Update noncompressed mode and include the new TPC step
(O) Finished
Incidentally, the final correction value is used continually while the transmission apparatus 100 remains in noncompressed mode.

Figure 14:
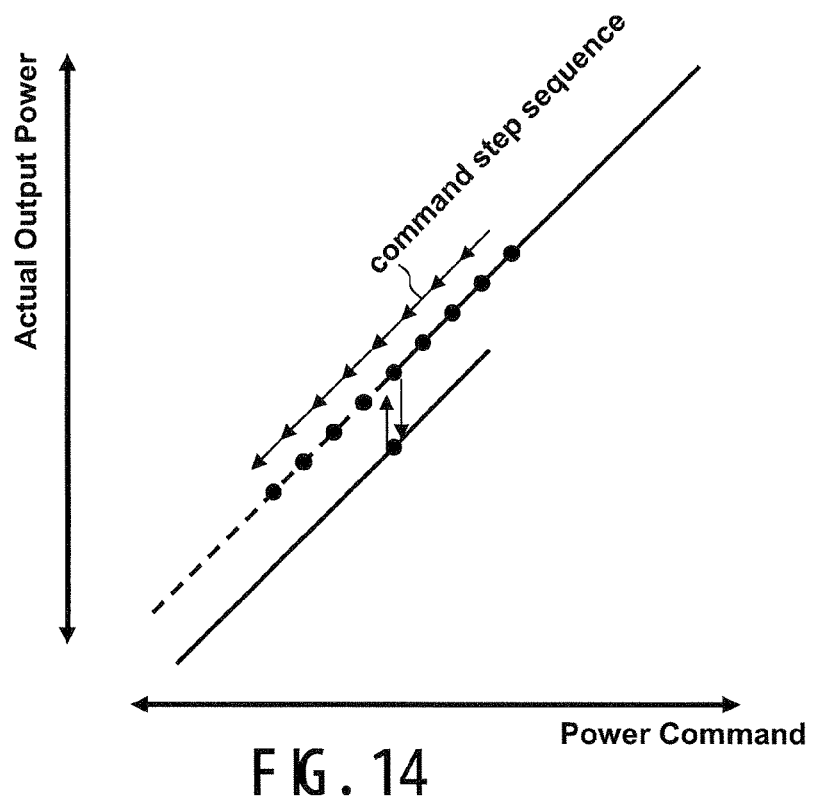
FIG. 14 illustrates −1 dB step sequence from compressed mode to noncompressed mode when output power of noncompressed mode is low.

FIG. 14 illustrates transition operation from compressed mode to noncompressed mode when output power of noncompressed mode is too low. FIG. 14 illustrates a simple case where transmission power is reduced by −1 dB at a time.

Figure 15:
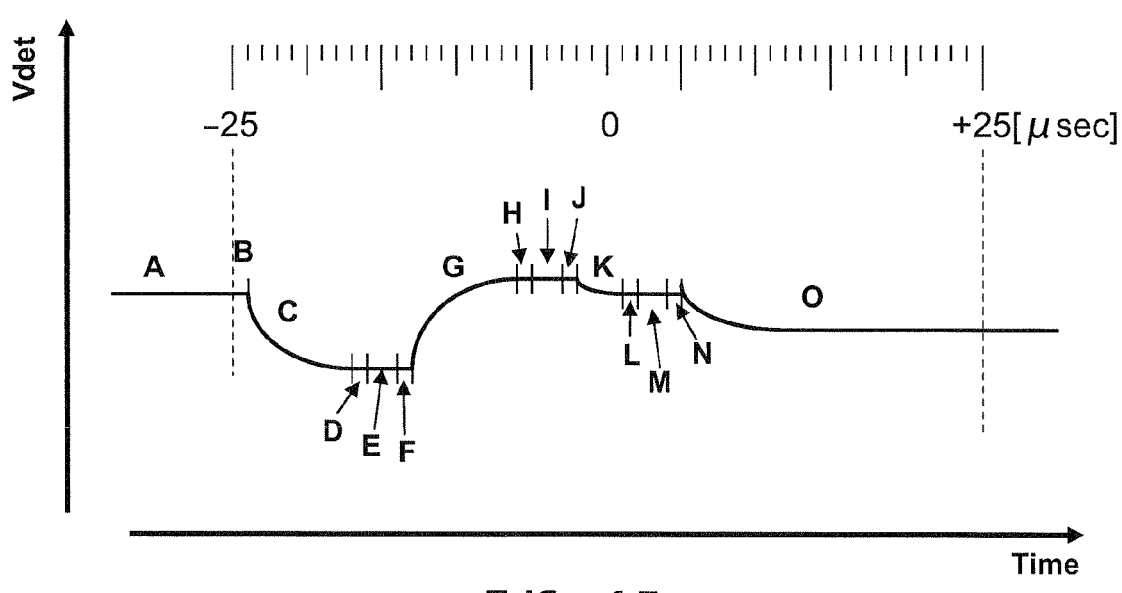
FIG. 15 illustrates in detail transition operation from compressed mode to noncompressed mode when output power of noncompressed mode is low.

FIG. 15 illustrates in detail how the transmission apparatus 100 transitions from compressed mode to noncompressed mode when output power of noncompressed mode is too low. The transmission apparatus 100 carries out the following operations (A) to (O) at the points shown in FIG. 15.
(A) Measure baseline Vdet in compressed mode
(B) Mode switch to noncompressed mode, same output power command
(C) Wait for Vdet to settle
(D) Read new Vdet
(E) Compute a first noncompressed mode power correction
(F) Command noncompressed mode with this new correction
(G) Wait for Vdet to settle
(H) Read new Vdet
(I) Compute a fine noncompressed mode power correction
(J) Command noncompressed mode with this updated correction
(K) Wait for Vdet to settle
(L) Read new Vdet
(M) Compute a final noncompressed mode power correction
(N) Command noncompressed mode according to TPC value
(O) Finished Transition from noncompressed mode to compressed mode will be described next.

First, +1 dB step will be explained.

Figure 16:
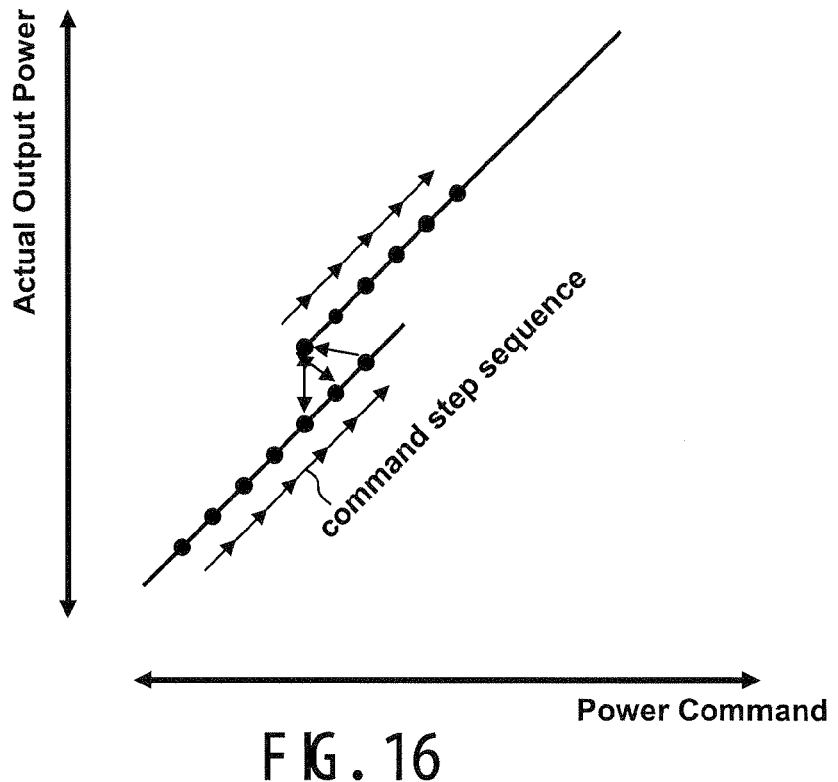
FIG. 16 illustrates +1 dB step sequence from noncompressed mode to compressed mode when output power of noncompressed mode is low.

FIG. 16 illustrates transition operation from noncompressed mode to compressed mode when output power of noncompressed mode is too low. FIG. 16 illustrates a simple case where transmission power is increased +1 dB at a time.

Figure 17:
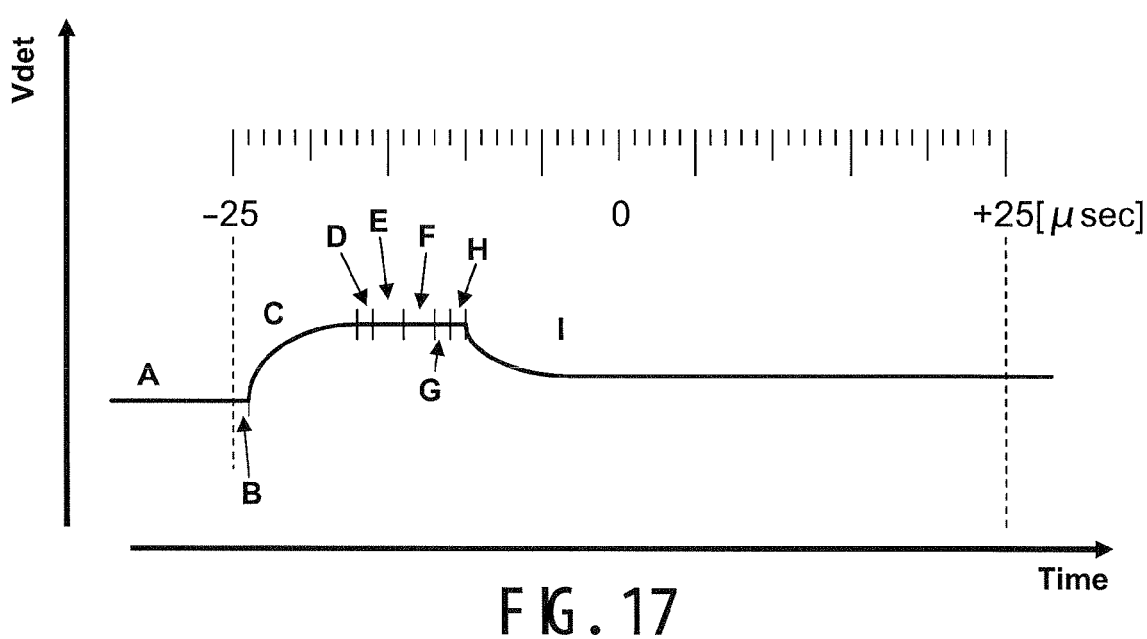
FIG. 17 illustrates in detail transition operation from noncompressed mode to compressed mode when output power of noncompressed mode is low.
Figure 18:
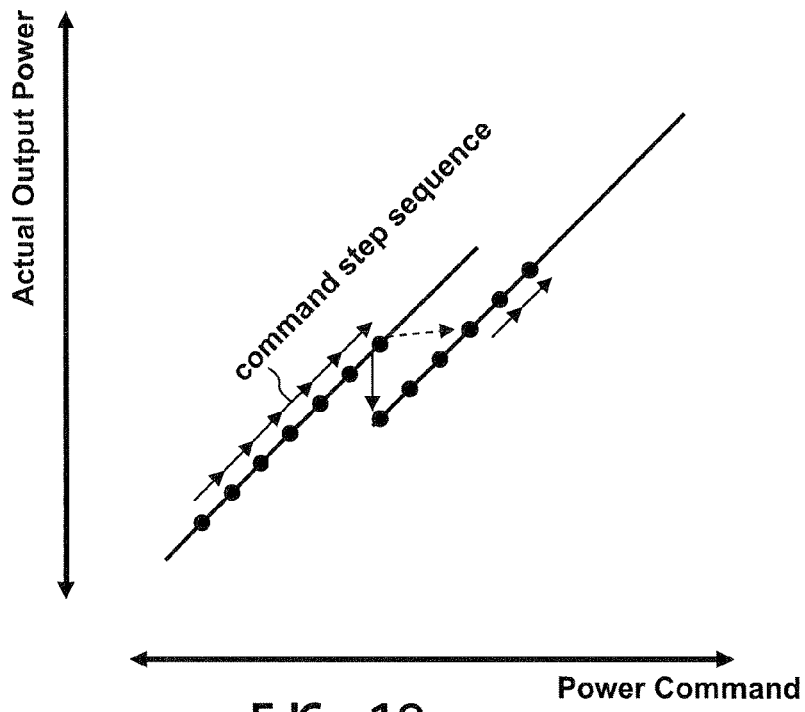
FIG. 18 illustrates +1 dB step sequence from noncompressed mode to compressed mode when output power of noncompressed mode is high.

FIG. 17 illustrates in detail how the transmission apparatus transitions from noncompressed mode to compressed mode when output power of noncompressed mode is too low. The transmission apparatus 100 carries out the following operations (A) to (I) at the points shown in FIG. 17.
(A) Measure baseline Vdet in noncompressed mode
(B) Mode switch to compressed mode, same output power command
(C) Wait for Vdet to settle
(D) Read new Vdet
(E) Compute noncompressed mode power error
(F) Compute index into compressed mode table
(G) Add TPC value onto compressed mode table index
(H) Command compressed mode with combined Index and TPC
(I) Finished FIG. 18 illustrates transition operation from noncompressed mode to compressed mode when output power of noncompressed mode is too high. FIG. 18 illustrates a simple case where transmission power is increased +1 dB at a time.

Figure 19:
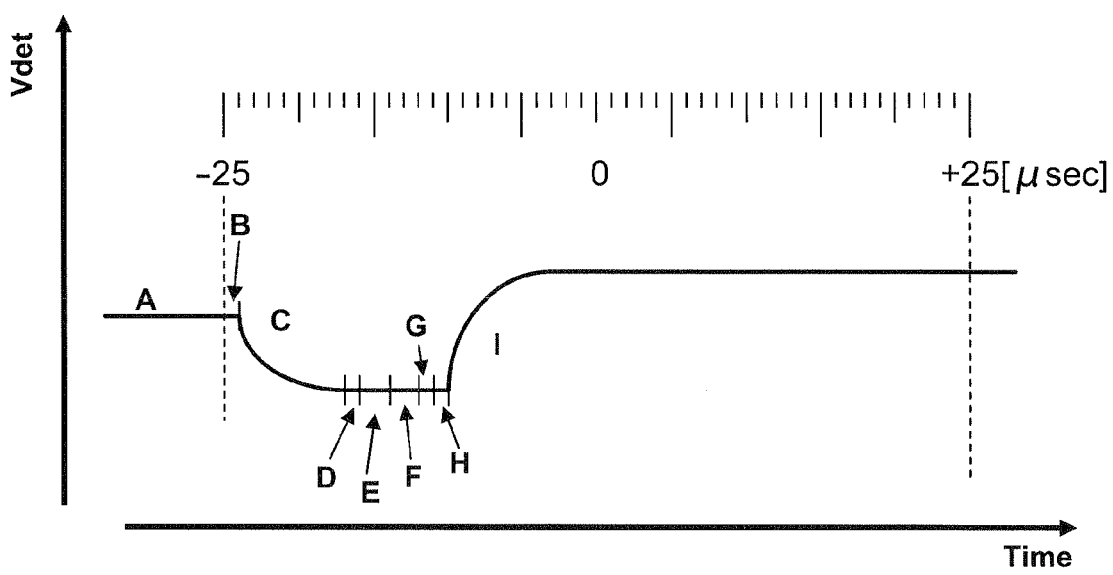
FIG. 19 illustrates in detail transition operation from noncompressed mode to compressed mode when output power of noncompressed mode is high.

FIG. 19 illustrates in detail how the transmission apparatus transitions from noncompressed mode to compressed mode when output power of noncompressed mode is too high. The transmission apparatus carries out the following operations (A) to (I) at the points shown in FIG. 19.
(A) Measure baseline Vdet in noncompressed mode
(B) Mode switch to compressed mode, same output power command
(C) Wait for Vdet to settle
(D) Read new Vdet
(E) Compute noncompressed mode power error
(F) Compute index into compressed mode table
(G) Add TPC value onto compressed mode table index
(H) Command compressed mode with combined Index and TPC
(I) Finished Incidentally, transition to compressed mode due to step of 4 dB or more does not require PAL, because the tolerance for 4 dB power step is ±2.0 dB, which can be achieved without PAL. In addition, temperature compensation can be applied, if necessary, to increase accuracy and the margin to the ±2.0 dB specification.

Likewise, transition to noncompressed mode due to step of 4 dB or more does not require PAL. Larger steps have larger error tolerances. The largest error tolerance ±6.0 dB is beyond the total drift of noncompressed mode.

The overall operation of the transmission apparatus 100 of the present embodiment will be described using the flowcharts of FIG. 21 and FIG. 22.

First, the parameters used in the flowcharts will be explained.

Pao: C1 attenuator gain offset due to PAL (dB). Applicable only in noncompressed mode.

Pinit: Initial, absolute, power level from baseband (dBm).

Ptable: Power level used to index power level dependent parameters (dBm).

Pca: Actual compressed mode power, as measured via PAL detector 106 (dBm).

Pna: Actual noncompressed mode power, as measured via PAL detector 106 (dBm).

Figure 20:
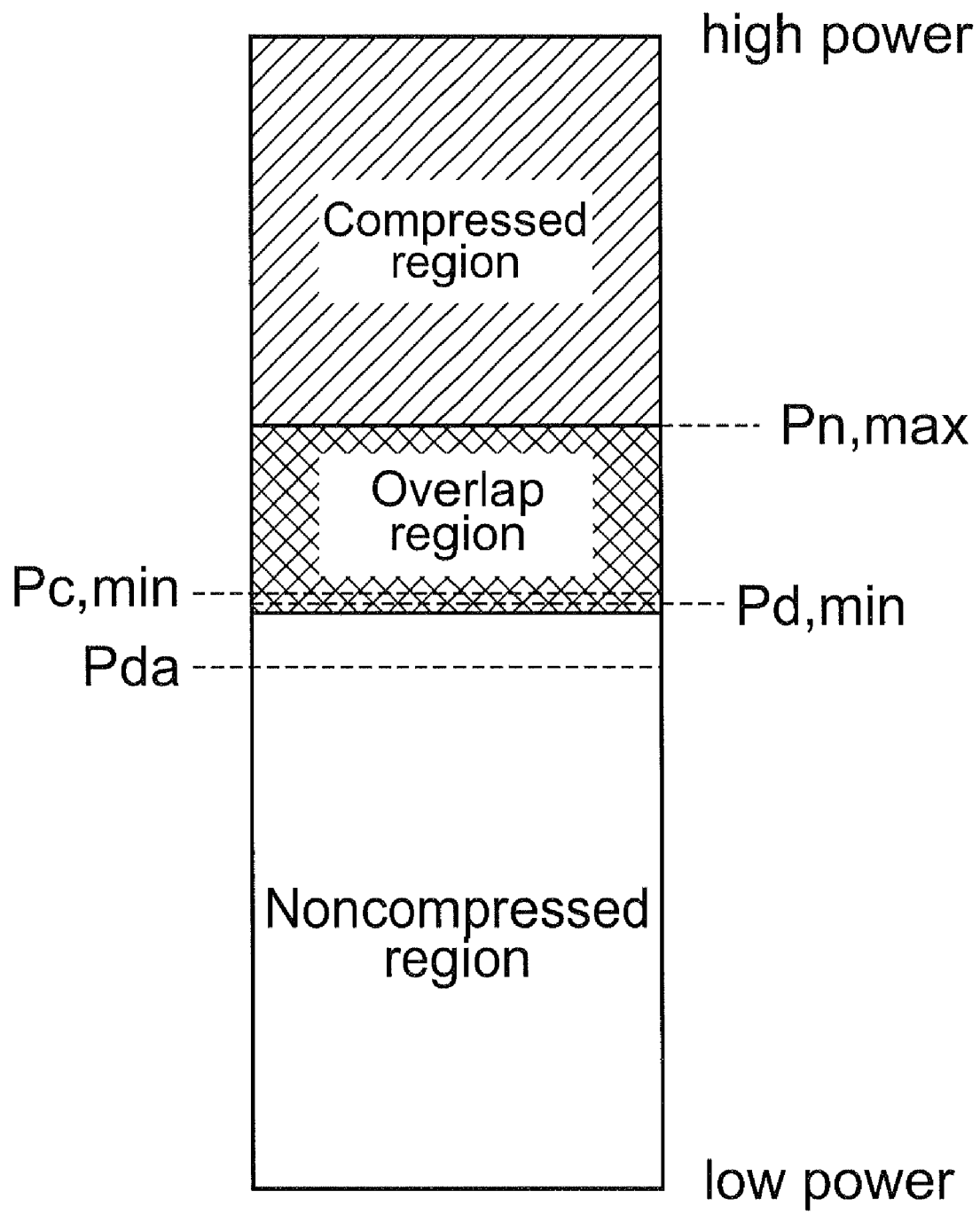
FIG. 20 illustrates PAL operation according to an embodiment of the present invention.

In addition, the parameters in FIG. 20 employ the following definitions:

Pc,min: Minimum compressed mode power level (dBm)

Pn,max: Maximum noncompressed mode power level (dBm).

Pda: Detector active power threshold (dBm). This is the lowest noncompressed mode power level that, due to tolerances, may actually produce a power level in the overlap region.

Pd,min: Lowest possible measured actual power at power level Pc,min (dBm).

Figure 21:
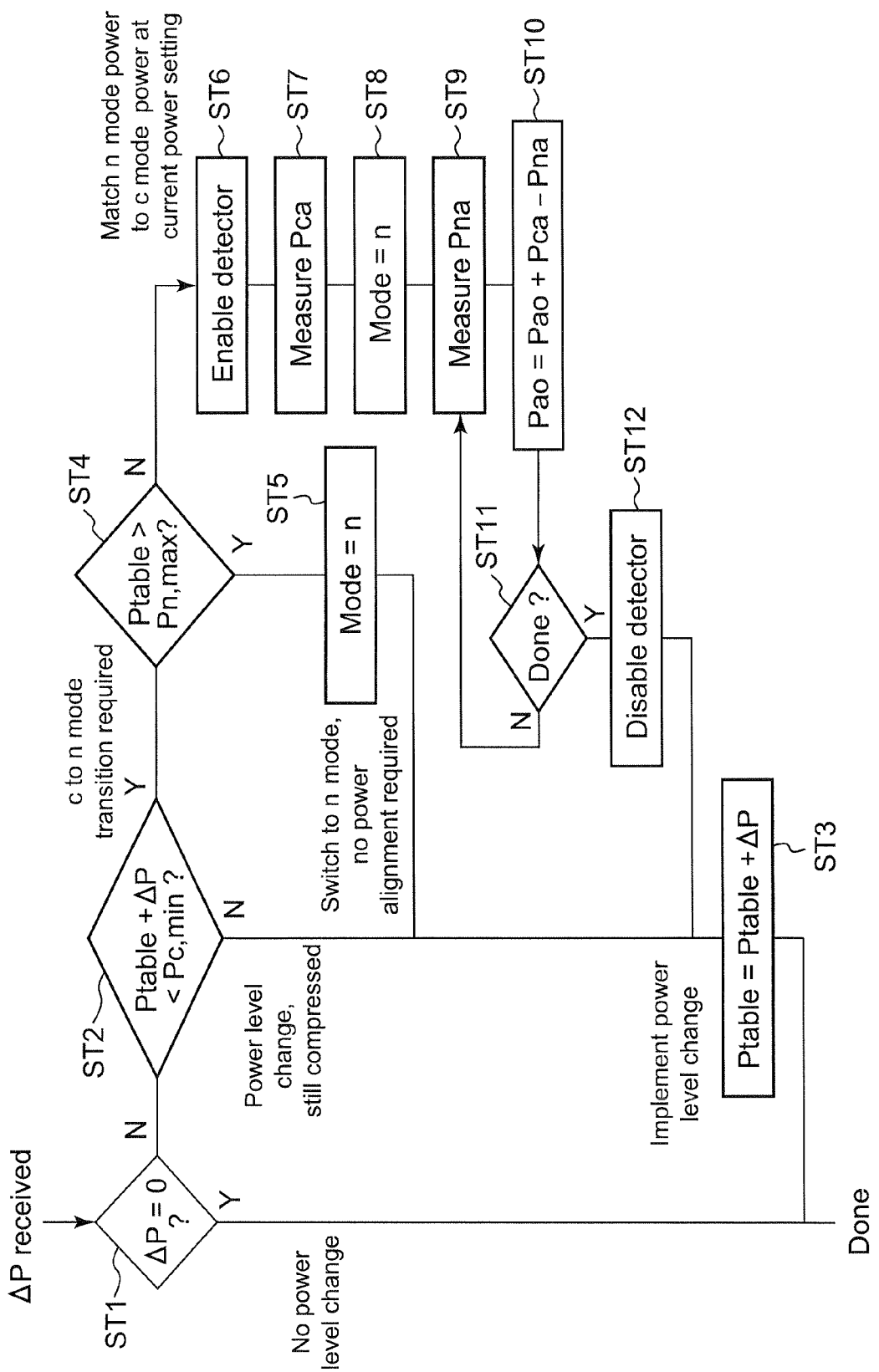
FIG. 21 is a flowchart explaining compressed mode operation.

FIG. 21 is a flowchart explaining compressed mode operation. In step ST1, the transmission power controller 107 detects the specified power change level ΔP, and the transmission apparatus 100 ends the flow if there is no change or moves on to step ST 2 if there is change. In step ST 2, if the value combining Ptable and the power change level ΔP obtained in the transmission power controller 107 is equal to or greater than the minimum value in the overlap region Pc,min (ST 2: "No"), the transmission power controller 107 determines compressed mode is possible, and the transmission apparatus 100 moves on to step ST 3, and the power is changed by ΔP. On the other hand, if the value combining Ptable and the power change level ΔP is less than the minimum value in the overlap region Pc,min (ST 2: "Yes"), the transmission power controller 107 determines that transition to noncompressed mode is necessary, and the transmission apparatus 100 moves on to step ST 4.

If a positive result is obtained in step ST 4, this means that the power changes so significantly that the PAL is not necessary. In this case, the transmission apparatus 100 moves on to step ST 5, simply transitions the mode to noncompressed mode, and then moves on to step ST 3. On the other hand, if a negative result is obtained in step ST 4, the transmission power controller 107 determines that PAL operation is necessary, and the transmission apparatus 100 moves on to step ST 6.

The transmission apparatus 100 turns on the power supply to the measurement system in step ST 6, measures the output power of the PA 103 in compressed mode in step ST 7, switches the mode to noncompressed mode in step ST 8, and measures the output power of the PA 103 in noncompressed mode in step ST 9. The transmission power controller 107 carries out error correction in step ST 10, checks whether or not error correction is finished in step ST 11, and, if error correction is finished, turns off the power supply to the measurement system in step ST 112, and the transmission apparatus 100 moves on to step ST 3; otherwise, steps 8 and 9 are repeated.

Figure 22:
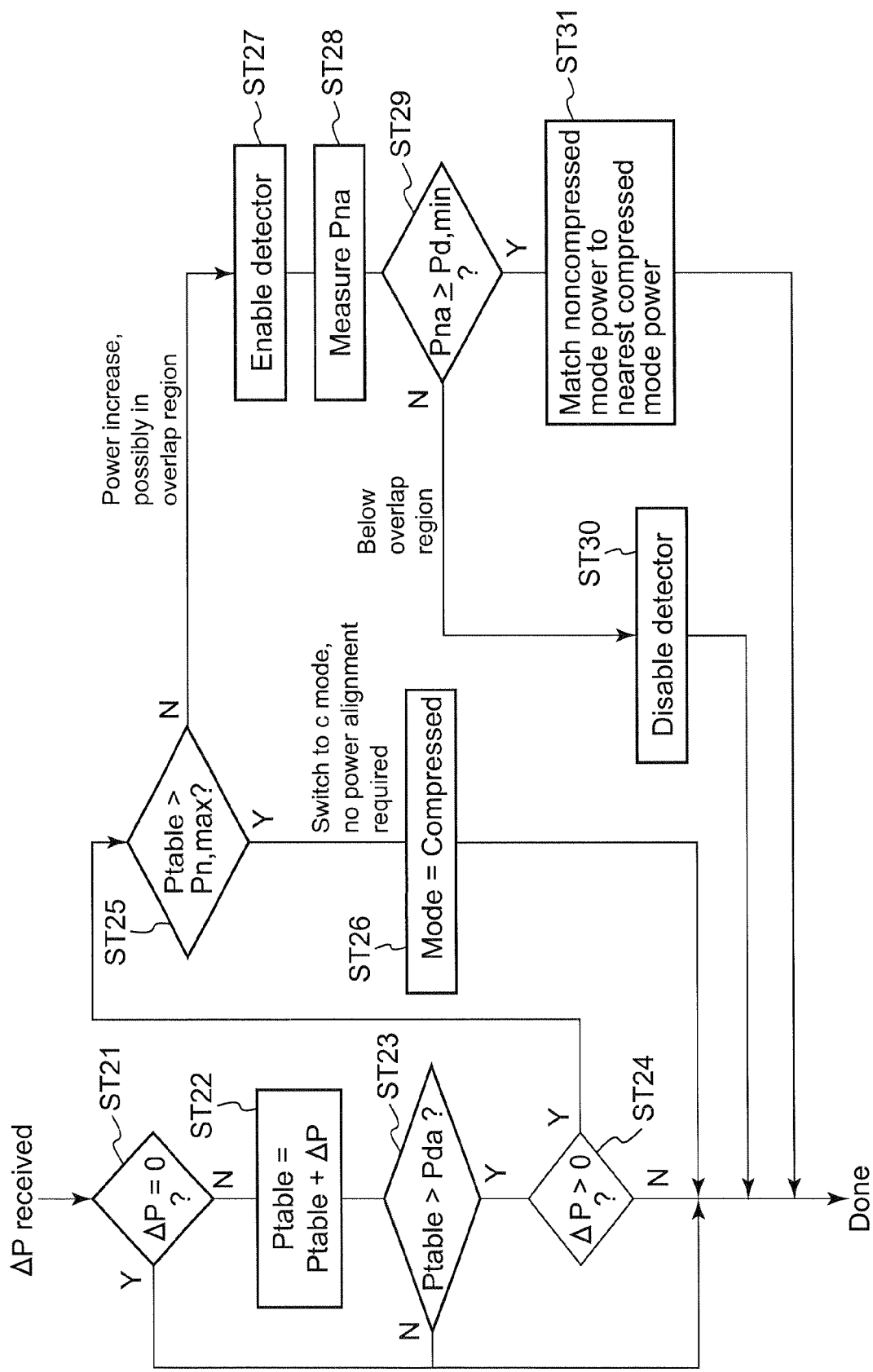
FIG. 22 is flowchart explaining noncompressed mode operation.

FIG. 22 is a flowchart explaining noncompressed mode operation.

The transmission power controller 107 detects the specified power change level ΔP in step ST 21, and the transmission apparatus 100 ends the flow if there is no change or moves on to step ST 22 if there is change, and the power is changed by ΔP. In step ST 23, the transmission power controller 107 determines whether or not the newly set power Ptable is within the noncompressed mode region. If Ptable is not in the noncompressed mode region, the transmission power controller determines whether or not the change level ΔP increases, in step ST 24. If a positive result is obtained in both step ST 23 and in step ST 24, this means that the specified power is within the noncompressed mode region, and so the transmission apparatus 100 moves on to step ST 25; otherwise, the operational flow is done.

If a positive result is obtained in step ST 25, this means that the power changes so significantly that PAL is not necessary. In this case, the transmission apparatus 100 moves on to step ST 26 and the transmission power controller 107 transitions the mode to compressed mode. On the other hand, if a negative result is obtained on step ST 25, the transmission power controller 107 determines that PAL operation is necessary, and the transmission apparatus 100 moves on to step ST 27.

The transmission apparatus 100 turns on the power supply to the measurement system in step ST 27 and measures the output power of the PA 103 in noncompressed mode in step ST 28. In step 29, the transmission apparatus 100 checks whether or not the output power of noncompressed mode has reached the overlap region, and, if it has not, turns off the power supply to the measurement system in step ST 30.

On the other hand, when the transmission apparatus 100 confirms that the output power has reached the overlap region, the transmission apparatus 100 moves on to step ST 31 and matches noncompressed mode power to nearest compressed mode power.

As described above, according to the embodiment of the present invention, the transmission apparatus operates in two modes of power amplifier operation, where: mode 1 (such as compressed mode) is inherently accurate; mode 2 (such as noncompressed mode) is inherently less accurate; and measurement of power amplifier output from mode 1 is used to correct power amplifier output in mode 2, so that drift in transmission power (discontinuity in output power) due to mode switching can be minimized even when inherently accurate mode 1 and inherently less accurate mode 2 switch.

Furthermore, according to the embodiment of the present invention, the transmission apparatus provides a scaling factor set for mode 1 (such as compressed mode) and a scaling factor set for mode 2 (such as noncompressed mode) having a region where the scaling factor sets overlap around a power border, and transmission power is controlled using these scaling factor sets, so that drift in transmission power (discontinuity in output power) due to mode switching can be minimized even when inherently accurate mode 1 and inherently less accurate mode 2 switch.

The present invention is not limited to the above described embodiments, and various variations and modifications may be possible without departing from the scope of the present invention. The foregoing description of implementations and embodiments of the invention have been presented for purposes of non-limiting illustration and description. Although the present invention has been described herein with reference to particular structures, materials and embodiments, the present invention is not intended to be limited to the particular features and details disclosed herein. Rather, the present invention extends to all functionally equivalent structures, methods and uses, such as are within the scope of the appended claims. The descriptions provided herein are not exhaustive and do not limit the invention to the precise forms disclosed. The foregoing embodiment examples have been provided merely for purposes of explanation and are in no way to be construed as limiting the scope of the present invention. The words that have been used herein are words of description and illustration, rather than words of limitation. The present teachings can readily be realized and applied to other types of apparatuses. Further, modifications and variations, within the purview, scope and sprit of the appended claims and their equivalents, as presently stated and as amended hereafter, are possible in light of the above teachings or may be acquired from practicing the invention. Furthermore, although elements of the invention may be described or claimed in the singular, the plural is contemplated unless limitation to the singular is explicitly stated Alternative structures discussed for the purpose of highlighting the invention's advantages do not constitute prior art unless expressly so identified. No one or more features of the present invention are necessary or critical unless otherwise specified.

What is claimed is:

1. A polar modulation transmitter comprising:
   a polar signal generation circuit that generates an amplitude component signal and a phase component signal from an input signal;
   a phase modulated signal generation circuit that generates a radio-frequency (RF) phase modulated signal from the generated phase component signal;
   a power amplifier;
   a variable amplifier that amplifies the RF phase modulated signal, based on a first scaling factor, and outputs the amplified RF phase modulated signal to the power amplifier;
   an amplitude control circuit that amplifies the generated amplitude component signal, based on a second scaling factor, and determines a supply voltage to the power amplifier;
   a detector that detects output power of the power amplifier while the power amplifier is operating in a compressed mode of amplification; and
   a transmission power controller that has a first scaling factor set for the compressed mode of amplification and a second scaling factor set for a non-compressed mode of amplification, the first and second scaling factor sets having a region where the first and second scaling factor sets overlap around a power border between the compressed mode of amplification and the non-compressed mode of amplification, and the transmission power controller controls transmission power using the first and second sealing factor sets, wherein:
   based on the output power detected by the detector, the transmission power controller corrects an output of the power amplifier while the power amplifier is operating in the non-compressed mode of amplification.

2. A transmission apparatus comprising:
   a power amplifier that amplifies an input signal to produce an output signal;
   a power measurement section that measures output power of the output signal while the power amplifier is operating in a compressed mode of amplification; and
   a transmission power controller that, based on the measured output power, corrects an output of the power amplifier while the power amplifier is operating in a non-compressed mode of amplification.

3. The transmission apparatus according to claim 2, wherein:
   the transmission power controller has a first scaling factor set for the power amplifier's compressed mode of operation and a second scaling factor set for the power amplifier's non-compressed mode of operation,
   the first and second scaling factors sets have a region where the first and second scaling factor sets overlap around a power border, and
   the transmission power controller controls a transmission power using the first and second scaling factor sets.

4. The transmission apparatus according to claim 3, wherein:
   upon a mode transition, the transmission power controller uses the first and second scaling factor sets for both modes that overlap and changes a scaling factor set for a mode of a transition destination based on the measured characteristic, and
   the measured characteristic is representative of transmission power.

5. The transmission apparatus according to claim 4, wherein the transmission power controller changes the scaling factor set for the mode of the transition destination by carrying out power alignment loop operations.

6. A cellular mobile including the transmission apparatus according to claim 5.

* * * * *

UNITED STATES PATENT AND TRADEMARK OFFICE
CERTIFICATE OF CORRECTION

| | | |
|---|---|---|
| PATENT NO. | : 8,064,855 B2 | Page 1 of 1 |
| APPLICATION NO. | : 11/923408 | |
| DATED | : November 22, 2011 | |
| INVENTOR(S) | : Earl McCune et al. | |

It is certified that error appears in the above-identified patent and that said Letters Patent is hereby corrected as shown below:

Claim 1, column 10, line 8, incorrectly reads:

"second sealing factor sets, wherein:"

and should read:

"second scaling factor sets, wherein:"

Claim 6, column 10, line 48, incorrectly reads:

"according to claim 5."

and should read:

"according to claim 2."

Signed and Sealed this
Fifth Day of February, 2013

Teresa Stanek Rea
*Acting Director of the United States Patent and Trademark Office*